(12) United States Patent
Tanaka et al.

(10) Patent No.: US 7,944,126 B2
(45) Date of Patent: May 17, 2011

(54) PIEZOELECTRIC CERAMIC, VIBRATOR AND ULTRASONIC MOTOR

(75) Inventors: Daisuke Tanaka, Tokyo (JP); Takeo Tsukada, Tokyo (JP); Masahito Furukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/581,468

(22) Filed: Oct. 19, 2009

(65) Prior Publication Data

US 2010/0096947 A1 Apr. 22, 2010

(30) Foreign Application Priority Data

Oct. 20, 2008 (JP) ................. P2008-270044
Dec. 11, 2008 (JP) ................. P2008-315756

(51) Int. Cl.
*H01L 41/08* (2006.01)
(52) U.S. Cl. .................................................. 310/358
(58) Field of Classification Search .......... 310/358; 252/62.9 PZ, 62.9 R; 361/321.4
See application file for complete search history.

(56) References Cited

U.S. PATENT DOCUMENTS

2007/0253145 A1* 11/2007 Kurozumi et al. ......... 361/321.4
2008/0145292 A1* 6/2008 Shirakawa et al. ........... 423/263

FOREIGN PATENT DOCUMENTS

JP 2003-055048 2/2003
JP 3785648 3/2006

* cited by examiner

*Primary Examiner* — Walter Benson
*Assistant Examiner* — Karen Addison
(74) *Attorney, Agent, or Firm* — Drinker Biddle & Reath LLP

(57) ABSTRACT

Provided is a piezoelectric ceramic 1 containing a compound represented by the following general formula (1), as a main component and at least one element selected from Mn, Fe and Cu in an amount of 0.04 to 0.6% by mass based on the main component, and a vibrator 10 having the piezoelectric ceramic 1 and electrodes 2, 3.

$$Ca_xBa_{1-x}TiO_3 \quad (1)$$

where, x satisfies $0.05 \leq x \leq 0.20$.

3 Claims, 4 Drawing Sheets

PIEZOELECTRIC CERAMIC, VIBRATOR AND ULTRASONIC MOTOR

BACKGROUND OF THE INVENTION

1. Field of the Invention

The present invention relates to a piezoelectric ceramic, a vibrator and an ultrasonic motor.

2. Related Background Art

Piezoelectric ceramics for use in ultrasonic motors, ultrasonic washers and piezoelectric transformers, and piezoelectric ceramics of piezoelectric actuators using resonance displacement are desired to have large resonance displacement and excellent piezoelectric properties. Particularly, when a piezoelectric ceramic is applied to the aforementioned uses, the drive frequency is high. Accordingly, if the mechanical quality factor (Qm) of the piezoelectric ceramic is low, heat easily generates and, for example, depolarization occurs and piezoelectric properties may change. For this reason, a piezoelectric ceramic having a sufficiently large mechanical quality factor (Qm) has been desired.

As a piezoelectric ceramic satisfying such properties, a perovskite-type compound such as a PZT ($PbZrO_3$—$PbTiO_3$ solid solution)-based compound and a PT ($PbTiO_3$)-based compound have been used (see, for example, Japanese Patent No. 3785648). However, since such a piezoelectric ceramic contains Pb, an environmental issue is a matter of concern. Therefore, various studies have been conducted on Pb-free compositions of a piezoelectric ceramic. For example, $BaTiO_3$-based and KNN ($KNbO_3$—$NaNbO_3$ solid solution)-based piezoelectric ceramics have been proposed (see, for example, Japanese Patent Application Laid-Open No. 2003-055048).

SUMMARY OF THE INVENTION

However, the $BaTiO_3$-based piezoelectric ceramic has a low mechanical quality factor compared to the PZT-based and the PT-based piezoelectric ceramics. It is therefore presently difficult to apply the $BaTiO_3$-based piezoelectric ceramic to the aforementioned uses. Furthermore, a KNN-based piezoelectric ceramic, since it uses a material containing Nb, has high material cost. In addition to this problem, since alkaline metals such as K and Na are used, composition deviation during a sintering process is likely to occur. Insufficient humidity resistance is another problem. Furthermore, it has been found that, conventional piezoelectric ceramics, even though its mechanical quality factor is sufficiently improved, cannot suppress self-heating during driving, thereby changing piezoelectric properties.

The present invention has been made in consideration of the above mentioned circumstances. It is an object of the present invention is to provide a piezoelectric ceramic with a sufficiently reduced Pb content, having a sufficiently excellent mechanical quality factor and capable of reducing heat generation during driving, and to provide a vibrator and an ultrasonic motor having such a piezoelectric ceramic.

To attain the aforementioned objects, the present invention provides a piezoelectric ceramic containing a compound represented by the following general formula (1) as a main component and at least one element selected from Mn, Fe and Cu in an amount of 0.04 to 0.6% by mass based on the main component.

$$Ca_xBa_{1-x}TiO_3 \quad (1)$$

where, x satisfies $0.05 \leq x \leq 0.20$.

Since the piezoelectric ceramic of the present invention does not contain Pb as a constituent element, the content of Pb is sufficiently reduced. Additionally, the piezoelectric ceramic has a sufficiently excellent mechanical quality factor. Thus, heat generation during driving can be reduced. The reason why such effects are obtained is not always clarified; however, the present inventors presume as follows: In $BaTiO_3$ having a perovskite structure ($ABO_3$), since a crystal phase transition temperature at which a crystal phase changes is near room temperature, if driving is performed at near room temperature, large heat generation tends to occur. In the present invention, since the A site of $BaTiO_3$ is partly substituted with Ca, the crystal phase transition temperature shifts toward a lower temperature side (near−50° C.), with the result that temperature stability near room temperature is presumably improved. In addition, since the B site of $BaTiO_3$ is partly substituted with Mn, Fe or Cu, oxygen holes are formed, with the result that pinning of a ferroelectric substance domain presumably occurs. They consider that by virtue of the synergetic effect of these, a piezoelectric ceramic having a sufficiently excellent mechanical quality factor and capable of reducing heat generation during driving can be obtained.

According to the piezoelectric ceramic having the aforementioned composition, even if Pb is not contained as a constituent element, a mechanical quality factor of 1000 or more can be attained while reducing heat generation during driving.

In the present invention, there is provided a vibrator having the aforementioned piezoelectric ceramic and electrodes. The vibrator of the present invention, since it has a piezoelectric ceramic having the aforementioned characteristics, can be particularly preferably used in a device using resonance displacement, such as a piezoelectric actuator, an ultrasonic motor, an ultrasonic vibrator and a piezoelectric transformer.

Furthermore, the present invention provides an ultrasonic motor having the above vibrator. Since the ultrasonic motor of the present invention has a piezoelectric ceramic having the aforementioned characteristics, the power thereof is sufficiently high.

According to the present invention, it is possible to provide a piezoelectric ceramic with a sufficiently reduced Pb content, having a sufficiently excellent mechanical quality factor and capable of reducing heat generation during driving, and to provide a vibrator and an ultrasonic motor having such a piezoelectric ceramic.

DESCRIPTION OF THE PREFERRED EMBODIMENTS

Figure 1:
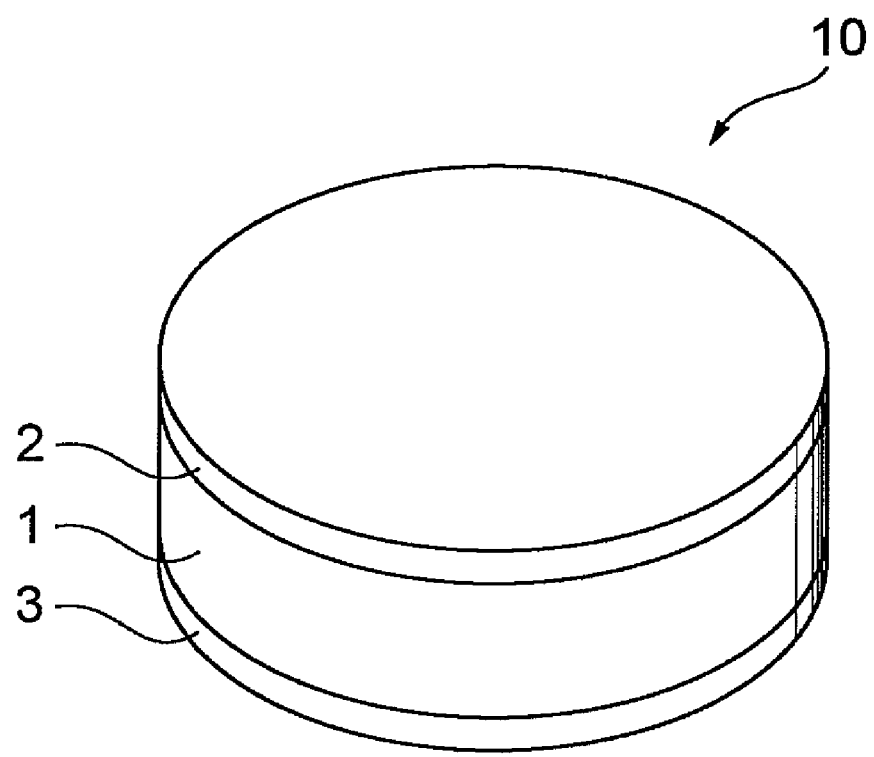
FIG. 1 is a perspective view showing a preferable embodiment of a vibrator according to the present invention.

Preferred embodiments of the present invention will be described, if necessary, with reference to the drawings. Note that in the drawings, the same or like reference numerals are used to designate the same or like constituent elements and any further explanation is omitted for brevity's sake.

FIG. 1 is a perspective view showing a preferable embodiment of a vibrator of the present invention. In FIG. 1, a vibrator 10 is composed of a piezoelectric ceramic (a piezoelectric ceramic body) 1 and a pair of electrodes 2, 3, which are respectively provided on the opposite surfaces of the piezoelectric ceramic 1 so as to sandwich the piezoelectric ceramic 1. The electrodes 2, 3 are formed of a metal such as silver.

The piezoelectric ceramic 1 is polarized, for example, in the thickness direction, that is, in the direction in which a pair of electrodes 2, 3 face each other, and vibrates in the radial direction when voltage is applied via the electrodes 2, 3. The electrodes 2, 3 each are formed of a metal, for example, Au. The electrodes 2, 3 can be electrically connected to an external power source via wire or the like (not shown).

The piezoelectric ceramic 1 contain a compound represented by the above general formula (1) as a main component and an other compound containing at least one element selected from Mn, Fe and Cu, as a subcomponent. The total content of subcomponents is 0.04 to 0.6% by mass based on the main component in terms of element.

The compound represented by the above general formula (1) has the perovskite structure ($ABO_3$) in which Ba of the A site is partly substituted with Ca. In the above general formula (1), x represents a molar ratio of Ba relative to the sum of Ba and Ca in the A site. In order to obtain a piezoelectric ceramic having a further excellent mechanical quality factor and sufficiently reducing heat generation during driving, x is preferably 0.08 to 0.20, and more preferably 0.1 to 0.20.

As described above, since the A site is partly substituted with Ca, a piezoelectric ceramic improved in temperature stability compared to $BaTiO_3$, having an excellent mechanical quality factor at normal temperature and capable of reducing heat generation during driving can be obtained.

As the compound containing at least one element selected from Mn, Fe and Cu and serving as a subcomponent in the piezoelectric ceramic 1, a compound having the B site of the perovskite structure (represented by the above general formula) containing at least one element selected from Mn, Fe and Cu, an Mn oxide, an Fe oxide and a Cu oxide, etc. may be mentioned.

When the piezoelectric ceramic 1 contains a compound containing Mn and/or Fe as a subcomponent, in order to obtain a piezoelectric ceramic having further excellent mechanical quality factor and capable of sufficiently reducing heat generation during driving, the content of the Mn compound in terms of Mn and the content of the Fe compound in terms of Fe, in total, is preferably 0.04 to 0.2% by mass, more preferably 0.048 to 0.18% by mass, and further preferably 0.08 to 0.15% by mass based on the main component.

When the piezoelectric ceramic 1 contains a compound containing Cu as a subcomponent, in order to obtain a piezoelectric ceramic having further excellent mechanical quality factor and capable of sufficiently reducing heat generation during driving, the content of the Cu compound in terms of Cu element is preferably 0.06 to 0.5% by mass, more preferably 0.09 to 0.4% by mass, further preferably 0.1 to 0.3% by mass based on the main component.

As described above, the preferable content ranges of subcomponents, Mn and Fe, differ from that of Cu. This is conceivable because the ionic radiuses of individual elements differ. Note that the piezoelectric ceramic 1 is generally composed of a sintered compact, more specifically, a polycrystalline substance. The subcomponent, as described above, may be a compound obtained by substituting the B site of the main component with Mn, Fe or Cu or may be a compound, such as an oxide compound, segregated in the grain boundary of a crystal grain of the main component.

The composition of the piezoelectric ceramic 1 can be measured, for example, by X-ray diffraction or ICP emission spectroscopic analysis. The content of a main component of the piezoelectric ceramic 1 is preferably not less than 90% by mass, more preferably not less than 95% by mass, and further preferably not less than 98% by mass based on the total (mass) of piezoelectric ceramic 1.

The piezoelectric ceramic 1 may contain Pb; however, the content thereof is preferably not more than 1% by mass, and more preferably 0. Since the content of Pb is sufficiently reduced in the piezoelectric ceramic, vaporization of Pb during sintering and release of Pb in the environment after it is commercially delivered as a piezoelectric component such as a piezoelectric device, and discarded, can be suppressed to a minimum.

The piezoelectric ceramic 1 preferably has a relative density of 95% or more. If the piezoelectric ceramic 1 has such a high relative density, further excellent piezoelectric property can be obtained. Note that, the relative density of the piezoelectric ceramic 1 can be determined by the Archimedes method. The relative density of the piezoelectric ceramic 1 can be controlled by varying a sintering temperature and sintering time. Furthermore, it is preferred that the crystal grain size of the piezoelectric ceramic 1 is 10 μm or less. When the crystal grain size exceeds 10 μm, it becomes difficult to sufficiently suppress migration of a domain, with the result that a mechanical quality factor tends to decrease.

Figure 2:
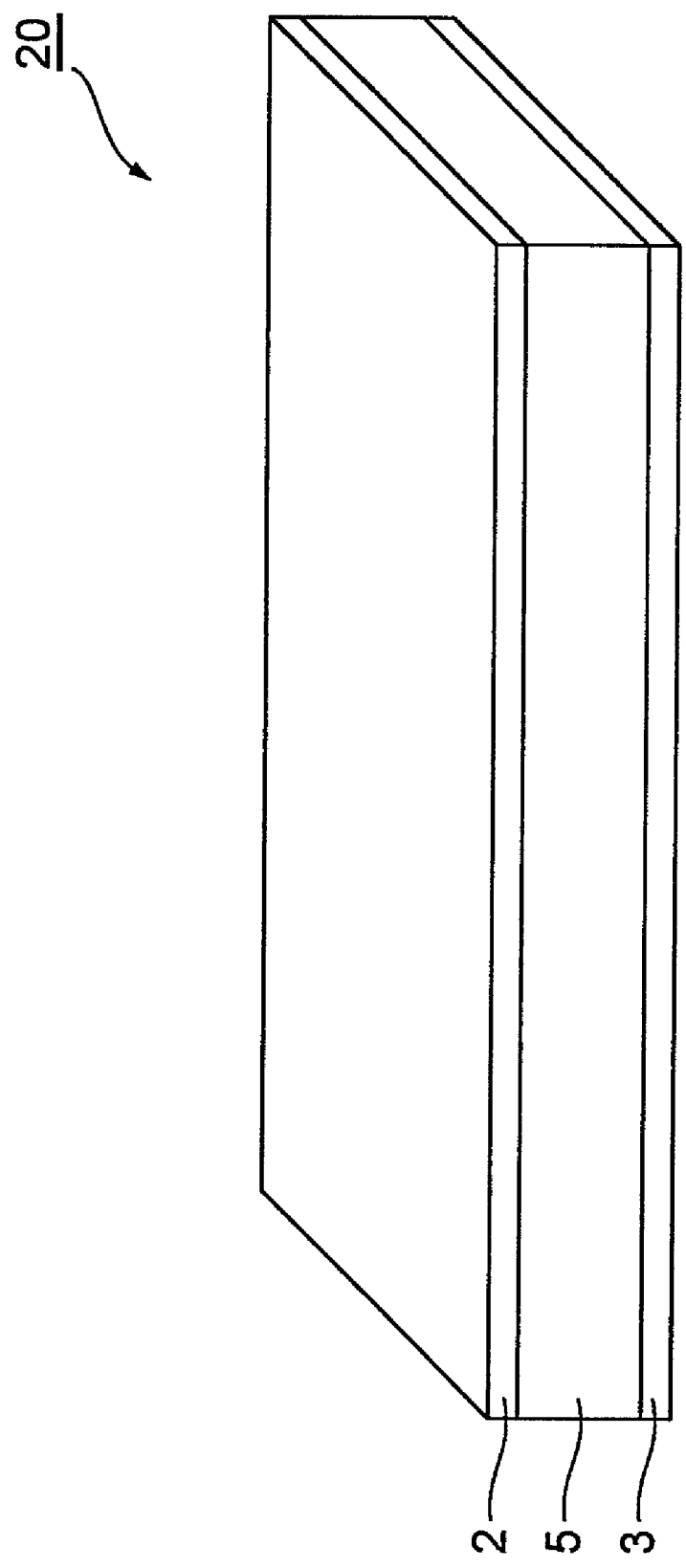
FIG. 2 is a perspective view showing another embodiment of the vibrator according to the present invention.

FIG. 2 is a perspective view showing another embodiment of the vibrator according to the present invention. In FIG. 2, a vibrator 20 is composed of a piezoelectric ceramic (a piezoelectric ceramic body) 5, a pair of electrodes 2, 3, which are respectively provided on the opposite surfaces of the piezoelectric ceramic 5 so as to sandwich the piezoelectric ceramic 5. The electrodes 2, 3 are formed of a metal such as silver.

The piezoelectric ceramic 5 is polarized, for example, in the thickness direction, that is, in the direction in which a pair of electrodes 2, 3 face each other, and elongates and vibrates in the long-side direction when voltage is applied via the electrodes 2, 3. The piezoelectric ceramic 5 has the same composition as that of the piezoelectric ceramic 1 according to the above embodiment. Therefore, the piezoelectric ceramic 5 has a sufficiently excellent mechanical quality factor, and also sufficiently reduces heat generation during driving.

Figure 3:
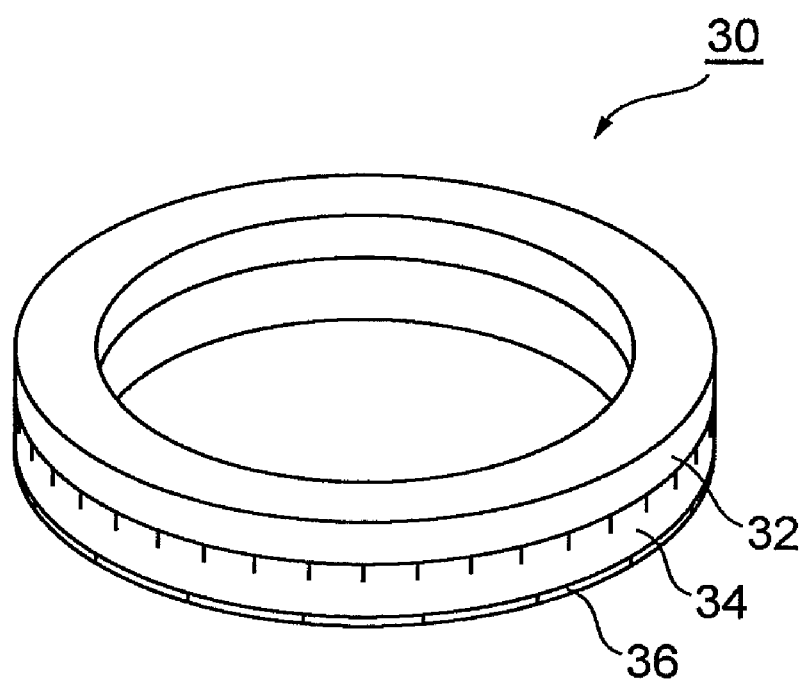
FIG. 3 is a perspective view showing a preferable embodiment of an ultrasonic motor according to the present invention.

FIG. 3 is a perspective view showing a preferable embodiment of an ultrasonic motor according to the present invention. An ultrasonic motor 30 is a traveling-wave type ultrasonic motor having a ring-form stator 34, a plurality of piezoelectric ceramics 36, which are provided onto one of the surfaces of the ring-form stator 34 and arranged along a circumference direction in such a manner that the polarization directions are alternately inverted, and a rotor 32 provided on the other surface of the ring-form stator 34.

Since the piezoelectric ceramics 36 to be provided to the ultrasonic motor 30 have the same composition as that of the piezoelectric ceramic 1 according to the above embodiment, they have an excellent mechanical quality factor and sufficiently reduce heat generation during driving. Accordingly, an ultrasonic motor having sufficiently high power can be obtained.

On the surfaces of the piezoelectric ceramics 36 opposite to the ring-form stator 34, electrodes (not shown) are individually provided. To the electrodes next to each other, two types of alternating voltages having a phase difference of 90° are respectively applied from a piezoelectric transformer. By this, the piezoelectric ceramics 36 are vibrated to drive the ultrasonic motor 30.

The piezoelectric ceramics, vibrator and ultrasonic motor according to the embodiments mentioned above can be manufactured by the following procedure.

As raw materials, $BaCO_3$ powder, $CaCO_3$ powder and $TiO_2$ powder are prepared. These raw-materials are sufficiently dried and weighed so as to obtain a composition of $Ca_xBa_{1-x}TiO_3$ ($0.05 \leq x \leq 0.20$).

The raw materials thus weighed are mixed well in an organic solvent or in water by a ball mill or the like, dried and sintered at 1000 to 1100° C. for 2 to 12 hours. In this manner, $Ca_xBa_{1-x}TiO_3$ powder can be obtained.

The $Ca_xBa_{1-x}TiO_3$ powder thus obtained is pulverized by a ball mill or the like until a particle size of 1 μm or less is obtained. To the pulverized $Ca_xBa_{1-x}TiO_3$ fine powder, a Mn compound such as $MnCO_3$, an Fe compound such as $Fe_2O_3$ or a Cu compound such as CuO is added in a predetermined ratio and mixed by use of a ball mill or the like.

After mixing, an organic solvent such as polyvinyl alcohol (PVA) is added to uniaxially compact to form a pellet. After, a binder is removed, the pellet is sintered at a temperature within the range of 1250 to 1300° C. for 5 to 10 hours in an airtight system to obtain a piezoelectric ceramic.

The piezoelectric ceramic thus obtained is polished into a disk form. In this manner, the piezoelectric ceramic 1 can be obtained. An electrode material such as silver is plated on each of the surfaces opposed to each other in perpendicular to the thickness direction of the piezoelectric ceramic 1 obtained to form the electrodes 2, 3 and subjected to a polarization treatment performed, for example, in silicone oil of 70° C. for 30 minutes at a direct current of 1 kV/mm. In this manner, a vibrator 10 can be obtained.

Furthermore, the piezoelectric ceramic obtained by sintering as described above is cut and polished into a rectangular shape to prepare the piezoelectric ceramic 5 according to the aforementioned embodiment. Onto the piezoelectric ceramic 5, the electrodes 2, 3 are formed and subjected to the polarization treatment in the same manner as in the vibrator 10 to obtain the vibrator 20. Furthermore, a ring-form stator and a rotor formed by a known method are provided to the piezoelectric ceramic(s) obtained in the same manner as above to form an ultrasonic motor.

The mechanical quality factors of the piezoelectric ceramics according to the above embodiments can be computationally obtained from the measurement results of a resonance frequency and an antiresonance frequency, which are obtained by use of a commercially available impedance analyzer, based on the Japan Electronics Manufacturers Association Standard (EMAS-6100).

In the foregoing, preferred embodiments of the present invention have been described; however, the present invention is not particularly limited to the embodiments. For example, a known structure may be employed except the structure of the piezoelectric ceramic(s) of the ultrasonic motor. Furthermore, the method for manufacturing the piezoelectric ceramic of the present invention is not particularly limited to the embodiments. For example, $Ca_xBa_{1-x}TiO_3$ may be manufactured by a hydrothermal synthesis method, etc.

EXAMPLES

The present invention will be more specifically described based on Examples and Comparative Examples; however, the present invention is not limited to the following examples.

[Preparation of Radial Vibrator]

Example 1

Commercially available $BaCO_3$ powder, $CaCO_3$ powder and $TiO_2$ powder were prepared. These raw-material powders were sufficiently dried, weighed so as to obtain a composition ratio of $Ca_{0.1}Ba_{0.9}TiO_3$, mixed well in an organic solvent by use of a ball mill and dried.

After dehydration, the mixture was sintered at 1000° C. for 2 hours to obtain $Ca_{0.1}Ba_{0.9}TiO_3$ powder. The $Ca_{0.1}Ba_{0.9}TiO_3$ powder thus obtained was pulverized by a ball mill until a particle size of 1 μm or less was obtained. $MnCO_3$ was added in the mass ratio (in terms of Mn) to the $Ca_{0.1}Ba_{0.9}TiO_3$, shown in Table 1 and mixed by a ball mill.

After mixed, polyvinyl alcohol (PVA) was added and uniaxially compacted at 1 MPa to obtain a pellet. The pellet was heated to 650° C. to remove a binder and sintered at a temperature within the range of 1250 to 1300° C. for 5 hours in an airtight system to obtain a sintered compact.

The sintered compact thus obtained was polished into a disk form having a diameter of 14 mm and a thickness of 1 mm. To opposite surfaces of the sintered compact in perpendicular to the thickness direction, silver electrodes were respectively plated. The resultant construct was thereafter subjected to a polarization treatment performed in silicone oil of 70° C. for 30 minutes at a direct current of 1 kV/mm to prepare a radial vibrator as shown in FIG. 1. This was regarded as a vibrator of Example 1.

Examples 2 to 5

Each radial vibrator was manufactured in the same manner as in Example 1 except that the addition amount of $MnCO_3$ in terms of Mn relative to $Ca_{0.1}Ba_{0.9}TiO_3$ was changed to that shown in Table 1. These were regarded as the vibrators of Examples 2 to 5.

Examples 6 to 9

Each radial vibrator was manufactured in the same manner as in Example 1 except that $Fe_2O_3$ was used in place of $MnCO_3$ and added in the mass ratio (in terms of Fe) relative to $Ca_{0.1}Ba_{0.9}TiO_3$ shown in Table 1. These were regarded as the vibrators of Examples 6 to 9.

Examples 10 to 13

Each radial vibrator was manufactured in the same manner as in Example 1 except that CuO was used in place of $MnCO_3$ and added in the mass ratio (in terms of Cu) relative to $Ca_{0.1}Ba_{0.9}TiO_3$ shown in Table 1. These were regarded as the vibrators of Examples 10 to 13.

Example 14

A radial vibrator was manufactured in the same manner as in Example 3 except that commercially available $BaCO_3$ powder, $CaCO_3$ powder and $TiO_2$ powder were weighed so as to obtain a composition ratio of $Ca_{0.05}Ba_{0.95}TiO_3$ and mixed. This was regarded as the vibrator of Example 14.

Example 15

A radial vibrator was manufactured in the same manner as in Example 3 except that commercially available $BaCO_3$ powder, $CaCO_3$ powder and $TiO_2$ powder were weighed so as to obtain a composition ratio of $Ca_{0.15}Ba_{0.85}TiO_3$ and mixed. This was regarded as the vibrator of Example 15.

Example 16

A radial vibrator was manufactured in the same manner as in Example 3 except that commercially available $BaCO_3$ powder, $CaCO_3$ powder and $TiO_2$ powder were weighed so as to obtain a composition ratio of $Ca_{0.2}Ba_{0.8}TiO_3$ and mixed. This was regarded as the vibrator of Example 16.

Comparative Example 1

A radial vibrator was manufactured in the same manner as in Example 1 except that $MnCO_3$ was not added. This was regarded as the vibrator of Comparative Example 1.

Comparative Example 2

Commercially available $BaCO_3$ powder and $TiO_2$ powder were prepared and these raw-materials were sufficiently dried. A radial vibrator was manufactured in the same manner as in Example 1 except that these raw-materials were weighed so as to obtain a composition ratio of $BaTiO_3$ and $MnCO_3$ was not added. This was regarded as the vibrator of Comparative Example 2.

Comparative Example 3

Commercially available $BaCO_3$ powder and $TiO_2$ powder were prepared and these raw-materials were sufficiently dried. A radial vibrator was manufactured in the same manner as in Example 1 except that these raw-materials were weighed so as to obtain a composition ratio of $BaTiO_3$. This was regarded as the vibrator of Comparative Example 3.

Comparative Examples 4 to 6

Each radial vibrator was manufactured in the same manner as in Comparative Example 3 except that the addition amount of $MnCO_3$ in terms of Mn relative to $BaTiO_3$ was changed to that as shown in Table 2. These were regarded as the vibrators of Comparative Examples 4 to 6.

Comparative Examples 7 to 10

Each radial vibrator was manufactured in the same manner as in Comparative Example 3 except that $Fe_2O_3$ was used in place of $MnCO_3$ and added in the mass ratio (in terms of Fe) relative to $BaTiO_3$ shown in Table 2. These were regarded as the vibrators of Comparative Examples 7 to 10.

Comparative Examples 11 to 14

Each radial vibrator was manufactured in the same manner as in Comparative Example 3 except that CuO was used in place of $MnCO_3$ and added in the mass ratio (in terms of Cu) relative to $BaTiO_3$ shown in Table 2. These were regarded as the vibrators of Comparative Examples 11 to 14.

Comparative Example 15

A radial vibrator was manufactured in the same manner as in Example 3 except that commercially available $BaCO_3$ powder, $CaCO_3$ powder and $TiO_2$ powder were weighed so as to obtain a composition ratio of $Ca_{0.02}Ba_{0.98}TiO_3$ and mixed. This was regarded as the vibrator of Comparative Example 15.

Comparative Example 16

A radial vibrator was manufactured in the same manner as in Example 3 except that commercially available $BaCO_3$ powder, $CaCO_3$ powder and $TiO_2$ powder were weighed so as to obtain a composition ratio of $Ca_{0.3}Ba_{0.7}TiO_3$ and mixed. This was regarded as the vibrator of Comparative Example 16.

[Evaluation of Mechanical Quality Factor]

Using an impedance analyzer (trade name: 4294A manufactured by Agilent Technology), the resonance frequency and antiresonance frequency of each of the radial vibrators manufactured in Examples and Comparative Examples were measured. Mechanical quality factor (Qm) was obtained from measurement values of the resonance frequency and antiresonance frequency in accordance with the Japan Electronics Manufacturers Association Standard (EMAS-6100). The results are as shown in Tables 1 and 2.

[Evaluation of Heat Generation Properties]

Figure 4:
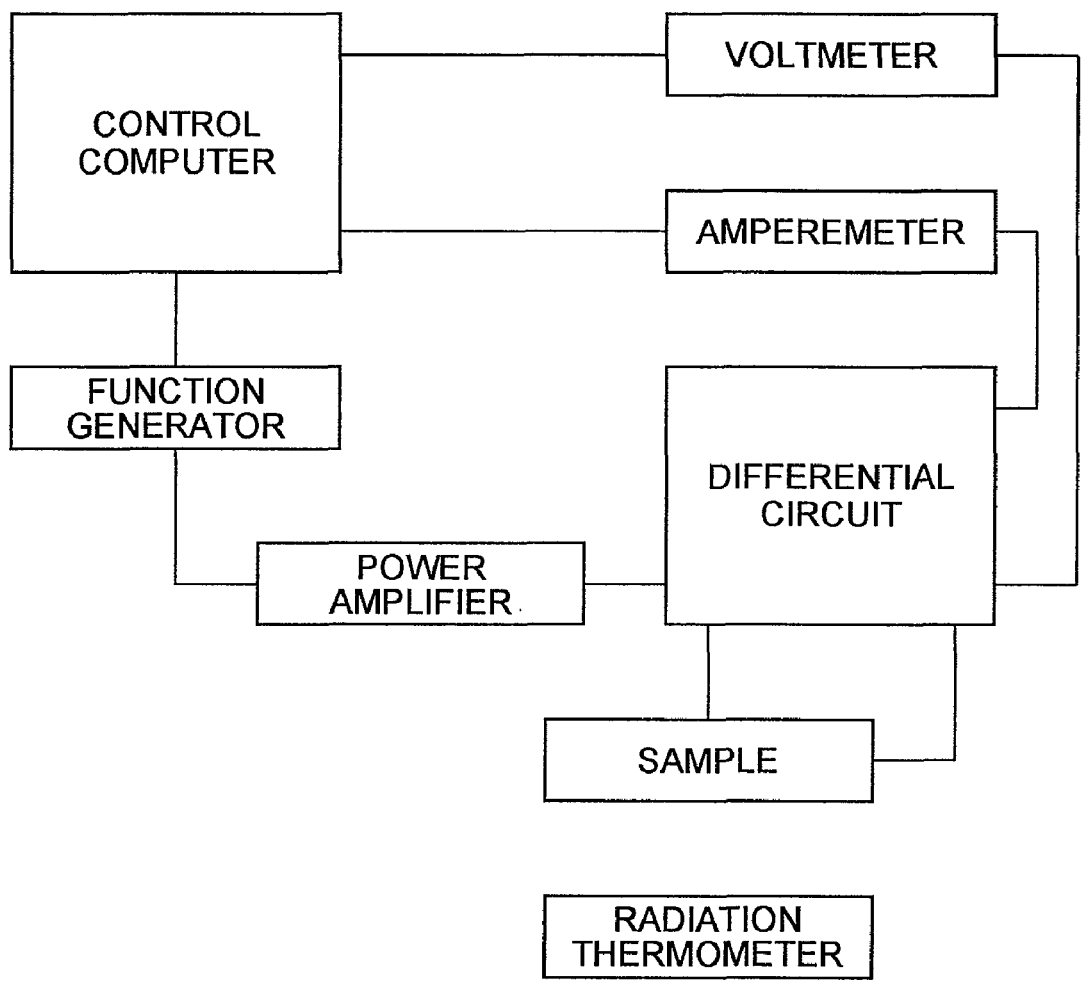
FIG. 4 is a diagram for illustrating the outline of an apparatus for measuring vibration velocity/heat used in evaluation of heat generation characteristics of a radial vibrator.

Next, using an apparatus for measuring vibration velocity/heat as shown in FIG. 4, the heat generation properties of a radial vibrator was evaluated. In the apparatus for measuring vibration velocity/heat shown in FIG. 4, the following components were used.

Function generator (trade name: NF1930A manufactured by NF Corporation)
Voltmeter (trade name: HP34401A manufactured by Hewlett-Packard)
Amperemeter (trade name: HP34401A manufactured by Hewlett-Packard)
Power amplifier (trade name: NF4010 manufactured by NF Corporation)
Radiation thermometer (trade name: YOKOGAWA 530 03 manufactured by Yokogawa Electric Corporation)

Heat generation of a radial vibrator was measured as dynamic property evaluation, as follows. A radial vibrator manufactured was connected to a position indicated as "sample" in FIG. 4, the temperature thereof (before driven) was measured by use of a radiation thermometer. Subsequently, the radial vibrator was driven at a vibration velocity of 0.5 m/s for 1 hour. After confirming that waveform is sufficiently stabilized, the temperature (after driven) of the radial vibrator was measured by the radiation thermometer. The temperature difference ($\Delta T$) between before-driven and after-driven was calculated. The results were as shown in Tables 1 and 2. Note that, a radial vibrator whose waveform was not stabilized even if a radial vibrator was driven for one hour, was regarded as a thermal runaway and evaluated as "NG".

TABLE 1

| | | Subcomponent | | | | |
| | | Mn (% by mass) | Fe (% by mass) | Cu (% by mass) | Qm | $\Delta T$ (° C.) |
| --- | --- | --- | --- | --- | --- | --- |
| Ex. 1 | $(Ca_{0.1}Ba_{0.9})TiO_3$ | 0.048 | — | — | 1089 | 9 |
| Ex. 2 | $(Ca_{0.1}Ba_{0.9})TiO_3$ | 0.096 | — | — | 1576 | 9 |
| Ex. 3 | $(Ca_{0.1}Ba_{0.9})TiO_3$ | 0.144 | — | — | 2383 | 7 |
| Ex. 4 | $(Ca_{0.1}Ba_{0.9})TiO_3$ | 0.192 | — | — | 804 | 12 |
| Ex. 5 | $(Ca_{0.1}Ba_{0.9})TiO_3$ | 0.240 | — | — | 508 | 15 |
| Ex. 6 | $(Ca_{0.1}Ba_{0.9})TiO_3$ | — | 0.048 | — | 1005 | 9 |

TABLE 1-continued

| | Main component | Subcomponent Mn (% by mass) | Fe (% by mass) | Cu (% by mass) | Qm | ΔT (° C.) |
|---|---|---|---|---|---|---|
| Ex. 7 | $(Ca_{0.1}Ba_{0.9})TiO_3$ | — | 0.096 | — | 1384 | 9 |
| Ex. 8 | $(Ca_{0.1}Ba_{0.9})TiO_3$ | — | 0.144 | — | 2145 | 8 |
| Ex. 9 | $(Ca_{0.1}Ba_{0.9})TiO_3$ | — | 0.192 | — | 724 | 14 |
| Ex. 10 | $(Ca_{0.1}Ba_{0.9})TiO_3$ | — | — | 0.048 | 851 | 12 |
| Ex. 11 | $(Ca_{0.1}Ba_{0.9})TiO_3$ | — | — | 0.096 | 1112 | 9 |
| Ex. 12 | $(Ca_{0.1}Ba_{0.9})TiO_3$ | — | — | 0.240 | 1092 | 9 |
| Ex. 13 | $(Ca_{0.1}Ba_{0.9})TiO_3$ | — | — | 0.588 | 524 | 15 |
| Ex. 14 | $(Ca_{0.05}Ba_{0.95})TiO_3$ | 0.144 | — | — | 1980 | 8 |
| Ex. 15 | $(Ca_{0.15}Ba_{0.85})TiO_3$ | 0.144 | — | — | 2512 | 8 |
| Ex. 16 | $(Ca_{0.2}Ba_{0.8})TiO_3$ | 0.144 | — | — | 2729 | 7 |

In the table, "—" represents non-addition.
% by mass of the subcomponent is a ratio relative to main component (100% by mass).

TABLE 2

| | Main component | Subcomponent Mn (% by mass) | Fe (% by mass) | Cu (% by mass) | Qm | ΔT (° C.) |
|---|---|---|---|---|---|---|
| Com. Ex. 1 | $(Ca_{0.1}Ba_{0.9})TiO_3$ | — | — | — | 220 | NG |
| Com. Ex. 2 | $BaTiO_3$ | — | — | — | 134 | NG |
| Com. Ex. 3 | $BaTiO_3$ | 0.048 | — | — | 1601 | 32 |
| Com. Ex. 4 | $BaTiO_3$ | 0.096 | — | — | 2851 | 29 |
| Com. Ex. 5 | $BaTiO_3$ | 0.144 | — | — | 1241 | 31 |
| Com. Ex. 6 | $BaTiO_3$ | 0.192 | — | — | 984 | 34 |
| Com. Ex. 7 | $BaTiO_3$ | — | 0.048 | — | 1435 | 33 |
| Com. Ex. 8 | $BaTiO_3$ | — | 0.096 | — | 2178 | 29 |
| Com. Ex. 9 | $BaTiO_3$ | — | 0.144 | — | 1112 | 35 |
| Com. Ex. 10 | $BaTiO_3$ | — | 0.192 | — | 969 | 33 |
| Com. Ex. 11 | $BaTiO_3$ | — | — | 0.048 | 943 | 35 |
| Com. Ex. 12 | $BaTiO_3$ | — | — | 0.096 | 1471 | 32 |
| Com. Ex. 13 | $BaTiO_3$ | — | — | 0.240 | 1430 | 32 |
| Com. Ex. 14 | $BaTiO_3$ | — | — | 0.588 | 997 | 36 |
| Com. Ex. 15 | $(Ca_{0.02}Ba_{0.98})TiO_3$ | 0.144 | — | — | 317 | NG |
| Com. Ex. 16 | $(Ca_{0.3}Ba_{0.7})TiO_3$ | 0.144 | — | — | 401 | NG |

In the table, "—" represents non-addition.
% by mass of the subcomponent is a ratio relative to main component (100% by mass).

From the results of Comparative Example 1 and Comparative Example 2 in Table 2, it was confirmed that the mechanical quality factor is improved by partially substituting the A site of $BaTiO_3$ with Ca. Furthermore, as shown in Table 1, the mechanical quality factor is greatly improved and heat generation (ΔT) during driving can be sufficiently suppressed by adding an Mn compound, an Fe compound or a Cu compound in a predetermined amount relative to a main component, in addition to Ca substitution. In all Examples 1 to 16, a mechanical quality factor was 500 or more and a ΔT value was 20° C. or less.

In Comparative Examples 3 to 14 in which an Mn compound, an Fe compound or a Cu compound was added to $BaTiO_3$ in a predetermined amount, heat generation during driving could not decrease. Furthermore, it was confirmed that in the case where the substitution amount of Ca is extremely low (Comparative Example 15), and in the case where the substitution amount of Ca is excessively large (Comparative Example 16), the mechanical quality factor is not virtually improved and the heat generation increases.

What is claimed is:

1. A piezoelectric ceramic comprising:
   a compound represented by the following general formula (1)

$$Ca_xBa_{1-x}TiO_3 \qquad (1)$$

where, x satisfies $0.05 \leq x \leq 0.20$, as a main component; and
   at least one element selected from Mn, Fe and Cu,
   wherein the content of the Mn compound in terms of Mn and the content of the Fe compound in terms of Fe, in total, is 0.048 to 0.18% by mass based on the main component, and the content of the Cu compound in terms of Cu element is 0.09 to 0.4% by mass based on the main component, and
   wherein the mechanical quality factor of the piezoelectric ceramic is 1,000 or more.

2. A vibrator comprising the piezoelectric ceramic according to claim 1 and electrodes.

3. An ultrasonic motor comprising the vibrator according to claim 2.

* * * * *